United States Patent
Soni et al.

(10) Patent No.: US 10,944,407 B1
(45) Date of Patent: Mar. 9, 2021

(54) SOURCE SYNCHRONOUS INTERFACE WITH SELECTABLE DELAY ON SOURCE AND DELAY ON DESTINATION CONTROL

(71) Applicant: STMicroelectronics International N.V., Geneva (CH)

(72) Inventors: Balwinder Singh Soni, Haryana (IN); Dinesh Chandra Joshi, Uttar Pradesh (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 16/892,009

(22) Filed: Jun. 3, 2020

(51) Int. Cl.
*H03L 7/081* (2006.01)
*H03K 3/037* (2006.01)
*H03L 7/07* (2006.01)

(52) U.S. Cl.
CPC .......... *H03L 7/0814* (2013.01); *H03K 3/037* (2013.01); *H03L 7/07* (2013.01); *H03L 7/0818* (2013.01)

(58) Field of Classification Search
CPC ....... H03L 7/0814; H03L 7/07; H03L 7/0818; H03K 3/037
USPC .......................................... 327/156
See application file for complete search history.

(56) References Cited

U.S. PATENT DOCUMENTS

| | | | |
|---|---|---|---|
| 5,909,473 A * | 6/1999 | Aoki ..................... | H04L 7/0338 370/503 |
| 6,278,755 B1 * | 8/2001 | Baba ..................... | H04L 7/0338 327/141 |
| 6,452,421 B2 * | 9/2002 | Saito ..................... | G06F 13/423 326/37 |
| 6,791,360 B2 | 9/2004 | Gauthier et al. | |
| 6,813,724 B2 | 11/2004 | Saito | |
| 6,937,680 B2 | 8/2005 | Fong et al. | |
| 7,177,307 B2 | 2/2007 | Frouin et al. | |
| 7,555,667 B1 | 6/2009 | Burney et al. | |
| 7,710,818 B2 | 5/2010 | Bae | |
| 7,764,715 B2 * | 7/2010 | Shaeffer ................. | H03M 9/00 370/519 |
| 8,467,486 B2 | 6/2013 | Pyeon | |
| 9,557,766 B1 | 1/2017 | Magee et al. | |
| 9,780,795 B2 | 10/2017 | Navid | |
| 10,243,571 B2 | 3/2019 | Navid | |
| 2014/0159780 A1 * | 6/2014 | Yang ....................... | H03L 7/08 327/115 |

* cited by examiner

*Primary Examiner* — Tomi Skibinski
(74) *Attorney, Agent, or Firm* — Crowe & Dunlevy

(57) ABSTRACT

A transmitter circuit for use in a source synchronous type interface includes a flip-flop having a data input configured to receive serial data, a clock input configured to receive a source clock and a data output coupled to a data line. A first multiplexer has a first input configured to receive the source clock, a second input configured to receive a phase shifted clock (shifted by ninety degrees from the source clock), and a clock output coupled to a clock line. A control circuit operates to control selection by the first multiplexer of the source clock as a transmit clock sent over the clock line for a delay on clock at destination implementation. Alternatively, the control circuit causes selection by the first multiplexer of the phase shifted clock as the transmit clock sent over the clock line if the system is configured for a delay on clock at source implementation.

34 Claims, 3 Drawing Sheets

SOURCE SYNCHRONOUS INTERFACE WITH SELECTABLE DELAY ON SOURCE AND DELAY ON DESTINATION CONTROL

TECHNICAL FIELD

The present invention generally relates to source synchronous type interface circuits and, in particular, to a source synchronous type interface with an enhanced configurability for selecting delay on source (DoS) and delay on destination (DoD) timing.

BACKGROUND

Reference is made to FIG. 1 which shows a block diagram for a source synchronous type interface. A first device 10 is interconnected to a second device 12. In this illustration, the first device 10 is functioning as a transmitter and the second device 12 is functioning as a receiver. As an example, the first device 10 may comprise a media access control (MAC) circuit and the second device 12 may comprise a physical layer (PHY) circuit. The transmitter (first) device 10 sends both data (TXDATA) and a clock (TXCLK) over a wired interconnect 16 that includes one or more data lines 16d and a clock line 16c. The lines 16d, 16c may, for example, each comprise a single physical wire (referenced to a common ground) or alternatively each support complementary (or differential) signaling using two physical wires.

In order to achieve correct capture of the data TXDATA at the second device 12, the clock used for data capture (referred to herein as the destination clock DSTCLK) at the second device 12 is preferably offset in phase from the clock used to generate the data (referred to as the source clock SRCCLK) at the first device 10 by ninety degrees. This phase offset can be accomplished in a number of ways.

FIG. 2A shows one option, referred to herein as delay on source (DoS), where a delay circuit 20 in the first device 10 generates the transmit clock TXCLK by applying a ninety degree phase shift to the source clock SRCCLK. The source clock SRCCLK is used to clock a flip-flop 22 whose input serially receives the data (Data) to be transmitted and whose output generates the transmit data TXDATA for application to the interface 16. In this implementation, since the transmit clock TXCLK is already ninety degrees phase shifted relative to the source clock SRCCLK, the transmit clock TXCLK as received by the second device 12 is the destination clock DSTCLK. The destination clock DSTCLK is used to clock a flip-flop 24 in the second device 12 whose input serially receives the transmit data TXDATA from the interconnect 16 and whose output produces the data (Data).

FIG. 2B shows another option, referred to herein as delay on destination (DoD), where a delay circuit 26 in the second device 12 generates the destination clock DSTCLK by applying a ninety degree phase shift to the transmit clock TXCLK received over the interface 16. The source clock SRCCLK in the first device 10 is used to clock a flip-flop 22 whose input serially receives the data (Data) to be transmitted and whose output generates the transmit data TXDATA for application to the interface 16. In this implementation, the transmit clock TXCLK is the source clock SRCCLK. The destination clock DSTCLK is used to clock a flip-flop 24 in the second device 12 whose input serially receives the transmit data TXDATA from the interconnect 16 and whose output produces the data (Data).

SUMMARY

In an embodiment, a system utilizes a source synchronous type interface and comprises: a transmitter circuit; and a receiver circuit; wherein the transmitter circuit is coupled to the receiver circuit using a source synchronous type interface including a data line and a clock line. The transmitter circuit comprises: a first flip-flop having a data input configured to receive serial data, a clock input configured to receive a source clock and a data output coupled to the data line; a first multiplexer having a first input configured to receive the source clock, a second input configured to receive a phase shifted clock, wherein the phase shifted clock is shifted by ninety degrees from the source clock, and a first clock output coupled to the clock line; and a control circuit configured to control selection by the first multiplexer of the source clock as a transmit clock sent over the clock line if the system is configured for delay on clock at destination in the receiver circuit, and control selection by the first multiplexer of the phase shifted clock as the transmit clock sent over the clock line if the system is configured for delay on clock at source in the transmitter circuit.

In an embodiment, a transmitter circuit for use in a source synchronous type interface comprises: a first flip-flop having a data input configured to receive serial data, a clock input configured to receive a source clock and a data output coupled to a data line; a first multiplexer having a first input configured to receive the source clock, a second input configured to receive a phase shifted clock, wherein the phase shifted clock is shifted by ninety degrees from the source clock, and a clock output coupled to a clock line; and a control circuit configured to control selection by the first multiplexer of the source clock as a transmit clock sent over the clock line for a delay on clock at destination configuration, and control selection by the first multiplexer of the phase shifted clock as the transmit clock sent over the clock line for a delay on clock at source configuration.

BRIEF DESCRIPTION OF THE DRAWINGS

For a better understanding of the embodiments, reference will now be made by way of example only to the accompanying figures in which.

DETAILED DESCRIPTION

Figure 1:
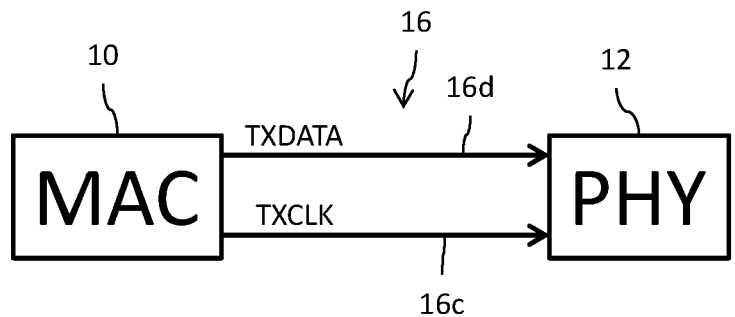
FIG. 1 shows a block diagram for a source synchronous type interface.
Figure 2A:
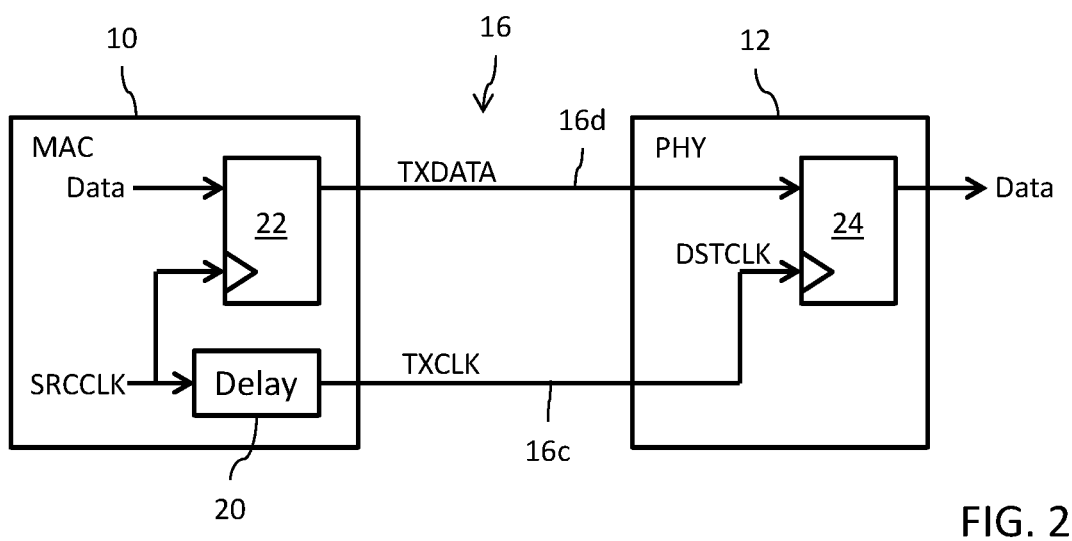
FIG. 2A shows a delay on source (DoS) implementation for the source synchronous type interface.
Figure 2B:
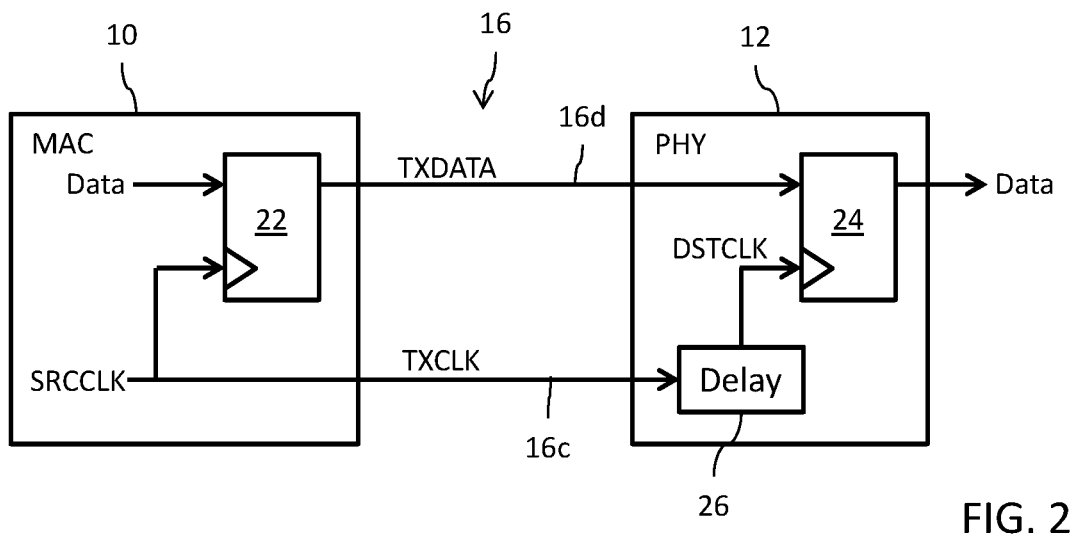
FIG. 2B shows a delay on destination (DoD) implementation for the source synchronous type interface.
Figure 3:
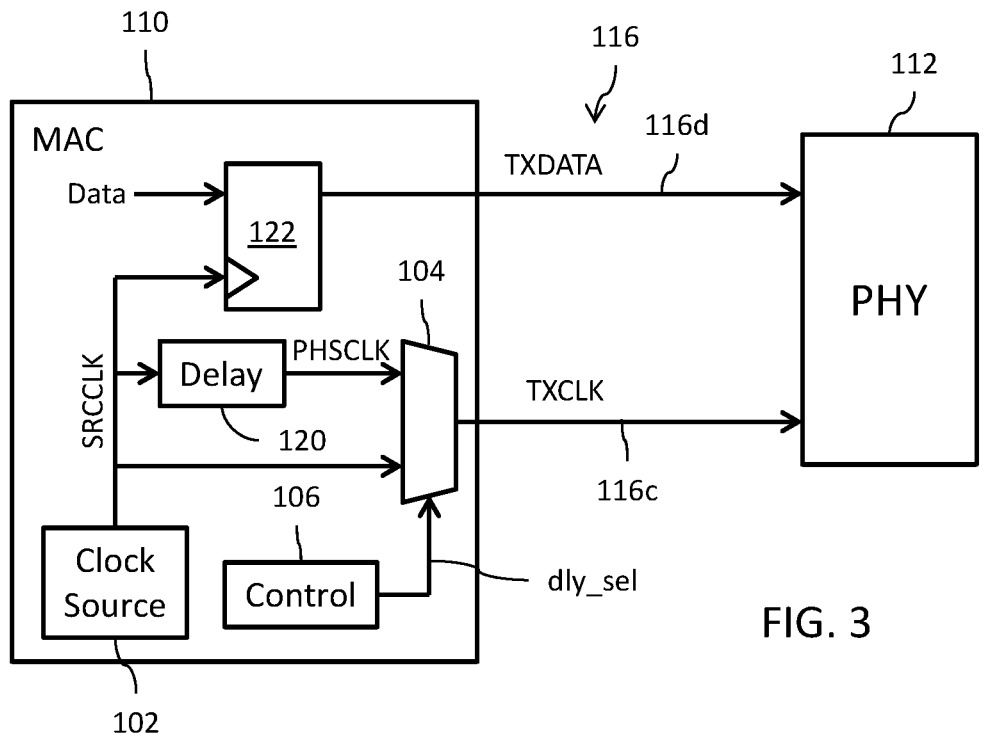
FIG. 3 shows a block diagram for a source synchronous type interface.

Reference is made to FIG. 3 which shows a block diagram for a source synchronous type interface. A first device 110 is interconnected to a second device 112. In this illustration, the first device 110 is functioning as a transmitter and the second device 112 is functioning as a receiver. As an example, the first device 110 may comprise a media access control (MAC) circuit and the second device 112 may comprise a physical layer (PHY) circuit. The transmitter (first) device 110 sends both data (TXDATA) and a clock (TXCLK) over a wired interconnect 116 that includes one or more data lines 116d and a clock line 116c. The lines 116d, 116c may, for example, each comprise a single physical wire (referenced to a common ground) or alternatively each support complementary (or differential) signaling using two physical wires.

The transmitter (first) device 110 includes a clock generator (source) circuit 102 configured to generate a source clock SRCCLK. The source clock SRCCLK is used to clock a flip-flop 122 whose input serially receives the data (Data) to be transmitted and whose output generates the transmit data TXDATA for application to a data line 116d of the interface 116. If multiple data lines 116d are used, there will be a clocked flip-flop 122 for each line along with multiple Data inputs. The source clock SRCCLK is further applied to a first input of a multiplexer circuit 104 and to the input of a delay circuit 120 which generates a phase shifted clock PHSCLK by applying a ninety degree phase shift to the source clock SRCCLK. The phase shifted clock PHSCLK is applied to a second input of the multiplexer circuit 104. The selection operation performed by the multiplexer circuit 104 is controlled by a control signal dly_sel. If the control signal dly_sel is in a first state, the multiplexer circuit 104 selects the source clock SRCCLK from the first input for output as the transmit clock TXCLK over the clock line 116c of the wired interconnect 116 (this being consistent with a delay on clock at destination (DoD) operation). Conversely, if the control signal dly_sel is in a second state, the multiplexer circuit 104 selects the phase shifted clock PHSCLK from the second input for output as the transmit clock TXCLK over the clock line 116c of the wired interconnect 116 (this being consistent with a delay on clock at source (DoS) operation).

The control signal dly_sel is generated by a control circuit 106. In an embodiment, the control circuit 106 may comprise a bit of a data register which is set to the first or second state dependent upon whether delay on clock is provided by the transmitter (first) device 110 (i.e., DoS) or the receiver (second) device 112 (i.e., DoD). For example, in a delay on source (DoS) configuration for the clock (where the receiver (second) device 112 does not include clock phase shift functionality), then the control signal dly_sel is in the second state so that the multiplexer circuit 104 selects the phase shifted clock PHSCLK as the transmit clock TXCLK. In a delay on destination (DoD) configuration for the clock (where the receiver (second) device 112 does include clock phase shift functionality), then the control signal dly_sel is in the first state so that the multiplexer circuit 104 selects the source clock SRCCLK as the transmit clock TXCLK. The setting of the state of the control signal dly_sel may be made by the control circuit 106 itself, or may be performed by another circuit of the transmitter (first) device 110 and communicated to the control circuit 106.

Figure 4:
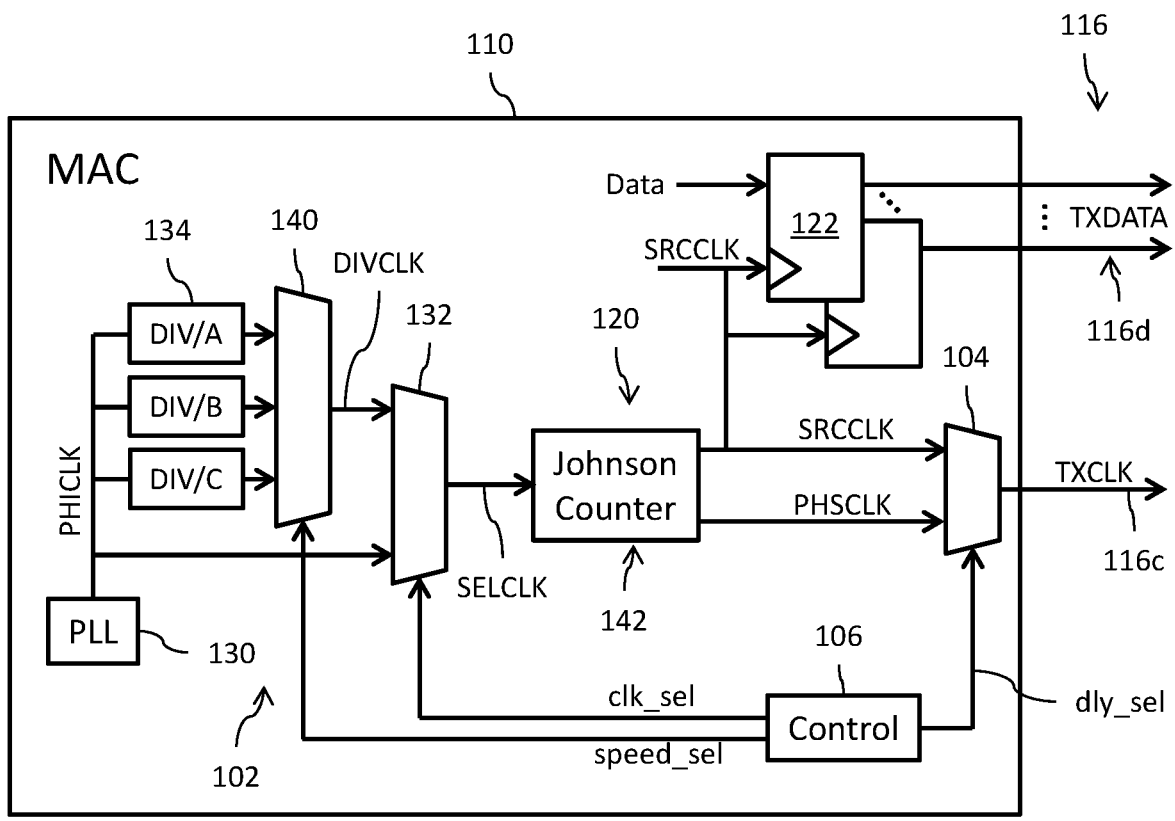
FIG. 4 shows a more detailed circuit implementation for the transmitter device of FIG. 3.

Reference is now made to FIG. 4 which shows a more detailed circuit implementation for the clock generator (source) circuit 102 and the delay circuit 120 of the transmitter (first) device 110. A phase lock loop (PLL) circuit 130 generates a clock signal PHICLK at a frequency fphi which is an integer multiple N times a highest required frequency ftx (i.e., fphi=N*ftx) for the transmit clock TXCLK for the interface 116. In this embodiment, N=4 due to a further frequency division by four operation performed by the delay circuit 120 (as will be described). The clock signal PHICLK is applied to a first input of a multiplexer 132 and further to the inputs of a plurality of frequency divider circuits 134. The outputs of the frequency divider circuits 134 are provided to corresponding inputs of a multiplexer 140, with the divided clock DIVCLK output of multiplexer 140 applied to a second input of the multiplexer 132. The output of the multiplexer 132 provides a selected clock SELCLK. The selected clock SELCLK is used to clock a divide by N Johnson counter circuit 142 which outputs the source clock SRCCLK and the phase shifted clock PHSCLK (in this case, as noted above, with a ninety degree phase shift relative to the source clock SRCCLK), each clock having a frequency is 1/N the frequency of the selected clock SELCLK.

The selection operation performed by the multiplexer circuit 140 is controlled by a control signal speed_sel. If the control signal speed_sel has a first state, the multiplexer circuit 140 selects the frequency divided (by A) clock signal output from the DIV/A frequency divider circuit 134 for application as the divided clock DIVCLK to the second input of the multiplexer 132. If the control signal speed_sel has a second state, the multiplexer circuit 140 selects the frequency divided (by B) clock signal output from the DIV/B frequency divider circuit 134 for application as the divided clock DIVCLK to the second input of the multiplexer 132. If the control signal speed_sel has a third state, the multiplexer circuit 140 selects the frequency divided (by C) clock signal output from the DIV/C frequency divider circuit 134 for application as the divided clock DIVCLK to the second input of the multiplexer 132.

The control signal speed_sel is generated by the control circuit 106. In an embodiment, the control circuit 106 may comprise a further set of bits of the data register which are set to the first, second or third states (for example, two bits set, respectively, to <0,0>, <0,1> or <1,0>) dependent on a desired speed (i.e., rate) for data communications over the interface 116.

The selection operation performed by the multiplexer circuit 132 is controlled by a control signal clk_sel. If the control signal clk_sel has a first state, the multiplexer circuit 132 selects the clock signal PHICLK for output as the selected clock SELCLK. If the control signal clk_sel has a second state, the multiplexer circuit 132 selects the divided clock DIVCLK from multiplexer 140 for output as the selected clock SELCLK.

The control signal clk_sel is also generated by the control circuit 106. In an embodiment, the control circuit 106 may comprise a further bit of the data register which is set to the first or second state dependent on whether the clock signal PHICLK (to be divided by N) or the divided clock DIVCLK (to be divided by N) is to be used for generating the transmit clock TXCLK.

Each frequency divider circuit 134 is configured to divide the frequency of the clock signal PHICLK by an integer value (those integer values indicated here as A, B and C in the implementation where three frequency divider circuits 134 are provided). In an embodiment, A=50, B=5 and C=1; but it will be understood that this is just by example and the values of A, B and C can be selected as desired for a given application. In the example embodiment, the values of A=50, B=5 and C=1 are chosen in connection with supporting an implementation of an Ethernet RGMII interface between the transmitter (first) device 110 and the receiver (second) device 112 which can operate at three different speeds: 10 Mbps, 100 Mbps and 1000 Mbps. In this implementation, the clock signal PHICLK is generated by the PLL 130 with a frequency fphi of 500 MHz. For clarification, in an implementation where there are four data lines 116d and one clock line 116c, the divide by four gives 125 MHz and with the four data lines being sampled on both the rising edge and falling edge of the clock, the overall data speed is 1000 Mbps. Additionally, a further division by five can be made to give a clock frequency of 25 MHz, and with four data lines being sampled on only the rising edge of the clock, the overall data speed is 100 Mbps.

So, for the frequency divider circuit 134 implemented with an integer divider value A=50, support is provided for Ethernet RGMII interface operation at 10 Mbps (by generating the divided clock DIVCLK at a frequency of 10 MHz). The clock frequency at the output of the Johnson counter would be 2.5 MHz and with four transmit lines the overall data speed would be 10 Mbps. In the case of the frequency divider circuit 134 implemented with an integer divider value B=5, support is provided for Ethernet RGMII interface operation at 100 Mbps (by generating the divided clock DIVCLK at a frequency of 100 MHz). The clock frequency at the output of the Johnson counter would be 25 MHz and with four transmit lines the overall data speed would be 100 Mbps. Likewise, with the frequency divider circuit 134 implemented with an integer divider value C=1, support is provided for Ethernet RGMII interface operation at 100 Mbps (by generating the divided clock DIVCLK at a frequency of 500 MHz). The clock frequency at the output of the Johnson counter would be 125 MHz and with four transmit lines (and sampling on both the leading edge and trailing edge, the overall data speed would be 1000 Mbps.

Figure 5:
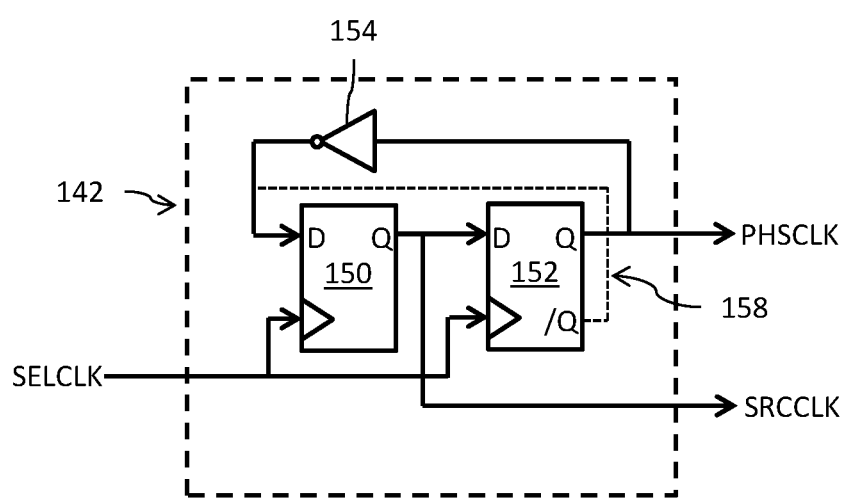
FIG. 5 shows a circuit diagram for a two bit Johnson counter circuit.

Reference is now made to FIG. 5, showing a circuit diagram for the Johnson counter circuit 142. The Johnson counter circuit 142 is a two-bit twisted ring counter comprising flip-flops 150 and 152 and a logic inverter 154 (NOT gate). The clock inputs of both flip-flops 150 and 152 receive the selected clock SELCLK. The data output Q of the flip-flop 150 is applied to the data input D of flip-flop 152. The data output Q of the flip-flop 152 is inverted by logic inverter 154 and applied to the data input D of flip-flop 150. The data output Q of the flip-flop 150 provides the source clock SRCCLK and the data output Q of the flip-flop 152 provides the phase shifted clock PHSCLK (in this case, as noted above, with a ninety degree phase shift relative to the source clock SRCCLK). Alternatively, the inverted data output /Q of the flip-flop 152 is applied to the data input D of flip-flop 150 (reference 158). The two bit implementation of the Johnson counter circuit 142 is effectively a frequency divide by four circuit, and thus the frequency of the source clock SRCCLK and phase shifted clock PHSCLK will be one-fourth the frequency of the selected clock SELCLK. The use of a frequency fphi set by N=4 for the clock signal PHICLK supports operation with a ninety degree phase shift using same edge clocked flip-flops only. Clocking both flip-flops 150 and 152 on the same edge of the selected clock SELCLK advantageously provides some margin for clock re-convergence pessimism removal (CRPR).

Operation of the transmitter (first) device 110 in multiple modes is supported. First, consider the case of an Ethernet RGMII interface operation. In this operating scenario, the control circuit 106 sets the state of the control signal clk_sel to cause the multiplexer 132 to select the divided clock DIVCLK for application to the Johnson counter 142 (because the integer frequency divisions provided by the frequency divider circuit 134 are specifically selected to support Ethernet RGMII interface speeds). The transmitter (first) device 110 will negotiate with the receiver (second) device 112 to determine the data transmission rate at one of three different speeds: 10 Mbps, 100 Mbps and 500 Mbps. This negotiation may, for example, be performed by the control circuit 106, or may be performed by another circuit of the transmitter (first) device 110 and communicated to the control circuit 106 for setting the state of the control signal speed_sel. If the negotiated rate is 10 Mbps, the control signal speed_sel is set to the first state and the clock signal output by the frequency divider circuit 134 with an integer divider value A=50 is selected by multiplexer 140 as the divided clock DIVCLK and passed through multiplexer 132 to provide the selected clock SELCLK. If the negotiated rate is 100 Mbps, the control signal speed_sel is set to the second state and the clock signal output by the frequency divider circuit 134 with an integer divider value B=5 is selected by multiplexer 140 as the divided clock DIVCLK and passed through multiplexer 132 to provide the selected clock SELCLK. If the negotiated rate is 1000 Mbps, the control signal speed_sel is set to the first state and the clock signal output by the frequency divider circuit 134 with an integer divider value C=1 is selected by multiplexer 140 as the divided clock DIVCLK and passed through multiplexer 132 to provide the selected clock SELCLK.

Second, consider the case of another interface operation (for example, non-Ethernet RGMII, or otherwise interface at non-standard Ethernet speeds) with a desired frequency ftx for the transmit clock TXCLK. The PLL circuit 130 is controlled to set the frequency fphi of the clock PHICLK at four times the frequency ftx. This control operation may, for example, be implemented by the control circuit 106, or may be performed by another circuit of the transmitter (first) device 110. In this operating scenario, the state of the control signal clk_sel is set to cause the multiplexer 132 to select the clock PHICLK for application to the Johnson counter 142.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. A system utilizing a source synchronous type interface, comprising:
   a transmitter circuit; and
   a receiver circuit;
   wherein the transmitter circuit is coupled to the receiver circuit using a source synchronous type interface including a data line and a clock line;
   wherein the transmitter circuit comprises:
      a first flip-flop having a data input configured to receive serial data, a clock input configured to receive a source clock and a data output coupled to the data line;
      a first multiplexer having a first input configured to receive the source clock, a second input configured to receive a phase shifted clock, wherein the phase shifted clock is shifted by ninety degrees from the source clock, and a first clock output coupled to the clock line; and
      a control circuit configured to control selection by the first multiplexer of the source clock as a transmit clock sent over the clock line if the system is configured for delay on clock at destination in the receiver circuit, and control selection by the first multiplexer of the phase shifted clock as the transmit clock sent over the clock line if the system is configured for delay on clock at source in the transmitter circuit.

2. The system of claim 1, wherein the receiver circuit comprises a second flip-flop having a data input coupled to receive transmit data sent over the data line and a clock input coupled to receive the transmit clock sent over the clock line.

3. The system of claim 1, further comprising a Johnson counter having an input configured to receive a selected clock, a first output generating the source clock from said selected clock and a second output generating the phase shifted clock from said selected clock.

4. The system of claim 3, wherein the Johnson counter is a two-bit counter.

5. The system of claim 3, wherein the Johnson counter implements a frequency division of the selected clock by an integer N to generate the source clock and the phase shifted clock.

6. The system of claim 5, wherein the source clock has a frequency which is N times a required frequency of the transmit clock to achieve a desired data transmission rate between the transmitter circuit and the receiver circuit over the source synchronous type interface.

7. The system of claim 3, further comprising:
a second multiplexer having a first input configured to receive a first clock, a second input configured to receive a second clock, wherein the first and second clocks are at different frequencies, and a second clock output generating the selected clock and coupled to the input of the Johnson counter.

8. The system of claim 7, wherein the control circuit is further configured to control selection by the second multiplexer of the first clock for the selected clock in connection with a first operational mode of the source synchronous type interface and control selection by the second multiplexer of the second clock for the selected clock in connection with a second operational mode of the source synchronous type interface.

9. The system of claim 8, wherein the first operational mode of the source synchronous type interface is a standard speed associated with an Ethernet RGMII interface operation and the second operational mode of the source synchronous type interface is a non-standard speed associated with an Ethernet operation.

10. The system of claim 9, further comprising a third multiplexer having a first input configured to receive a third clock, a second input configured to receive a fourth clock, wherein the third and fourth clocks are at different frequencies and wherein frequencies of the third and fourth clocks are associated with different standard speeds for the Ethernet RGMII interface operation, and a third clock output generating the first clock and coupled to the first input of the second multiplexer.

11. The system of claim 10, wherein the control circuit is further configured to control selection by the third multiplexer of the third clock in connection with a first standard speed for the Ethernet RGMII interface operation and control selection by the third multiplexer of the fourth clock in connection with a second, different, standard speed for the Ethernet RGMII interface operation.

12. The system of claim 10, further comprising:
a first frequency divider having an input configured to receive the second clock and an output generating the third clock and coupled to first input of the third multiplexer; and
a second frequency divider having an input configured to receive the second clock and an output generating the fourth clock and coupled to second input of the third multiplexer.

13. The system of claim 12, further comprising a phase lock loop configured to generate the second clock.

14. The system of claim 1, further comprising a clock dividing and phase shifting circuit having an input configured to receive a selected clock, a first output generating the source clock which is frequency divided from said selected clock and a second output generating the phase shifted clock which is frequency divided from said selected clock.

15. The system of claim 14, wherein the clock dividing and phase shifting circuit implements a frequency division of the selected clock by an integer N to generate the source clock and the phase shifted clock.

16. The system of claim 15, wherein the source clock has a frequency which is N times a required frequency of the transmit clock to achieve a desired data transmission rate between the transmitter circuit and the receiver circuit over the source synchronous type interface.

17. The system of claim 14, further comprising:
a second multiplexer having a first input configured to receive a first clock, a second input configured to receive a second clock, wherein the first and second clocks are at different frequencies, and a second clock output generating the selected clock and coupled to the input of the clock dividing and phase shifting circuit.

18. The system of claim 17, wherein the control circuit is further configured to control selection by the second multiplexer of the first clock for the selected clock in connection with a first operational mode of the source synchronous type interface and control selection by the second multiplexer of the second clock for the selected clock in connection with a second operational mode of the source synchronous type interface.

19. The system of claim 18, wherein the first operational mode of the source synchronous type interface is a standard speed associated with an Ethernet RGMII interface operation and the second operational mode of the source synchronous type interface is a non-standard speed associated with an Ethernet operation.

20. The system of claim 19, further comprising a third multiplexer having a first input configured to receive a third clock, a second input configured to receive a fourth clock, wherein the third and fourth clocks are at different frequencies and wherein frequencies of the third and fourth clocks are associated with different standard speeds for the Ethernet RGMII interface operation, and a third clock output generating the first clock and coupled to the first input of the second multiplexer.

21. The system of claim 20, wherein the control circuit is further configured to control selection by the third multiplexer of the third clock in connection with a first standard speed for the Ethernet RGMII interface operation and control selection by the third multiplexer of the fourth clock in connection with a second, different, standard speed for the Ethernet RGMII interface operation.

22. The system of claim 20, further comprising:
a first frequency divider having an input configured to receive the second clock and an output generating the third clock and coupled to first input of the third multiplexer; and
a second frequency divider having an input configured to receive the second clock and an output generating the fourth clock and coupled to second input of the third multiplexer.

23. The system of claim 22, further comprising a phase lock loop configured to generate the second clock.

24. A transmitter circuit for use in a source synchronous type interface comprises:
a first flip-flop having a data input configured to receive serial data, a clock input configured to receive a source clock and a data output coupled to a data line;
a first multiplexer having a first input configured to receive the source clock, a second input configured to receive a phase shifted clock, wherein the phase shifted clock is shifted by ninety degrees from the source clock, and a clock output coupled to a clock line; and a control circuit configured to control selection by the first multiplexer of the source lock as a transmit clock sent over the clock line for a delay on clock at destination configuration, and control selection by the first multiplexer of the phase shifted clock as the transmit clock sent over the clock line for a delay on clock at source configuration.

25. The transmitter circuit of claim 24, further comprising a clock dividing and phase shifting circuit having an input configured to receive a selected clock, a first output generating the source clock which is frequency divided from said selected clock and a second output generating the phase shifted clock which is frequency divided from said selected clock.

26. The transmitter circuit of claim 25, wherein the clock dividing and phase shifting circuit implements a frequency division of the selected clock by an integer N to generate the source clock and the phase shifted clock.

27. The transmitter circuit of claim 26, wherein the source clock has a frequency which is N times a required frequency of the transmit clock to achieve a desired data transmission rate from the transmitter circuit over the source synchronous type interface.

28. The transmitter circuit of claim 25, further comprising:
a second multiplexer having a first input configured to receive a first clock, a second input configured to receive a second clock, wherein the first and second clocks are at different frequencies, and a second clock output generating the selected clock and coupled to the input of the clock dividing and phase shifting circuit.

29. The transmitter circuit of claim 28, wherein the control circuit is further configured to control selection by the second multiplexer of the first clock for the selected clock in connection with a first operational mode of the source synchronous type interface and control selection by the second multiplexer of the second clock for the selected clock in connection with a second operational mode of the source synchronous type interface.

30. The transmitter circuit of claim 29, wherein the first operational mode of the source synchronous type interface is a standard speed associated with an Ethernet RGMII interface operation and the second operational mode of the source synchronous type interface is a non-standard speed associated with an Ethernet operation.

31. The transmitter circuit of claim 30, further comprising a third multiplexer having a first input configured to receive a third clock, a second input configured to receive a fourth clock, wherein the third and fourth clocks are at different frequencies and wherein frequencies of the third and fourth clocks are associated with different standard speeds for the Ethernet RGMII interface operation, and a third clock output generating the first clock and coupled to the first input of the second multiplexer.

32. The transmitter circuit of claim 31, wherein the control circuit is further configured to control selection by the third multiplexer of the third clock in connection with a first standard speed for the Ethernet RGMII interface operation and control selection by the third multiplexer of the fourth clock in connection with a second, different, standard speed for the Ethernet RGMII interface operation.

33. The transmitter circuit of claim 31, further comprising:
a first frequency divider having an input configured to receive the second clock and an output generating the third clock and coupled to first input of the third multiplexer; and
a second frequency divider having an input configured to receive the second clock and an output generating the fourth clock and coupled to second input of the third multiplexer.

34. The transmitter circuit of claim 33, further comprising a phase lock loop configured to generate the second clock.

* * * * *